United States Patent

Weber et al.

[11] Patent Number: 5,932,300
[45] Date of Patent: Aug. 3, 1999

[54] PROCESS FOR THE CURRENTLESS METALLIZATION OF ELECTRICALLY NON-CONDUCTIVE SUBSTRATES

[75] Inventors: Lothar Weber, Stuttgart; Kurt Schmid, Ditzingen; Ralf Haug; Dorothee Kling, both of Leonberg, all of Germany

[73] Assignee: Robert Bosch GmbH, Stuttgart, Germany

[21] Appl. No.: 08/913,378

[22] PCT Filed: Feb. 9, 1996

[86] PCT No.: PCT/DE96/00201

§ 371 Date: Sep. 8, 1997

§ 102(e) Date: Sep. 8, 1997

[87] PCT Pub. No.: WO96/28588

PCT Pub. Date: Sep. 19, 1996

[30] Foreign Application Priority Data

Mar. 9, 1995 [DE] Germany .................. 195 08 341

[51] Int. Cl.$^6$ ........................................ C08F 2/48
[52] U.S. Cl. .................. 427/508; 427/304; 427/322; 427/404; 427/443.1; 427/558; 427/581
[58] Field of Search ................... 427/558, 581, 427/304, 322, 404, 443.1, 508

[56] References Cited

FOREIGN PATENT DOCUMENTS 0255012 2/1988 European Pat. Off. .

OTHER PUBLICATIONS

IBM Technical Disclosure Bulletin, Metallizing Nonconductive Substrates, Haines, vol. 8, No. 9, Feb. 1966.

*Primary Examiner*—Bernard Pianalto
*Attorney, Agent, or Firm*—Venable; Norman N. Kunitz; Ashley J. Wells

[57] ABSTRACT

A process for the currentless metallization of electrically non-conductive substrates, includes providing a substrate which is electrically non-conductive; depositing on the substrate a positive lacquer comprising at least one polymer which is UV hardenable, at least one organo-metalllic compound, and a substance which is light-active to provide a positive lacquer coated substrate; irradiating the positive lacquer coated substrate with UV radiation to provide an irradiated coated substrate; and precipitating a metal layer onto the irradiated coated substrate by currentless metallization in a bath effective therefore.

11 Claims, 4 Drawing Sheets

PROCESS FOR THE CURRENTLESS METALLIZATION OF ELECTRICALLY NON-CONDUCTIVE SUBSTRATES

BACKGROUND OF THE INVENTION

1. Field of the Invention

The invention concerns a process for the currentless metallization of electrically non-conductive substrates on polymer base with a layer of UV hardenable lacquer, containing an organo-metallic palladium compound.

2. Description of the Related Art

Processes for the currentless metallization of electrically non-conductive substrates are known. Such a process is explained, for example, in the EP-PS 0 255 012 B1. For this process, an activator formulation containing a bonding agent is deposited on the electrically non-conductive substrate as carrier layer for the metallization. The solvent is removed from the activator formulation, which contains metal compounds in addition to bonding agents and solvents. The activator formulation is then reduced, and the substrate is metallized without current in a generally known metallization bath. The disadvantage of the known process is that the adhesion of the metallization on the substrate is not sufficient for all application cases, e.g. for the production of strip conductors with an extremely small reference grid.

SUMMARY OF THE INVENTION

In contrast, the advantage of the process according to the invention is that it is possible to obtain a metallization of extremely fine structures with high adhesiveness when the substrate is treated with UV radiation, for which the wavelength, time interval and radiation intensity can be selected, such that oxygen compounds of the polymer or the polymers develop on the substrate surface. Owing to the fact that a positive lacquer containing organic metal compounds is applied to the substrate, that the positive lacquer is subsequently irradiated with UV light and the metallization is precipitated onto the irradiated positive lacquer, it is advantageously possible to produce metallization structures with high adhesiveness, which can be reproduced in large piece numbers. The process according to the invention does not include a heat-intensive process step, so that even heat-sensitive substrates onto which the metallization is deposited can be used.

One preferred embodiment of the invention provides that the irradiation with UV light occurs at a specific wave length that can be selected and/or during a specific time interval that can be selected. The subsequent precipitating of the metallization onto the irradiated positive lacquer can be influenced advantageously through the selection of the wave length and the time interval for the irradiation. The metallization can thus be adjusted in such a way that an intermediate metal oxide layer is deposited first, on which the actual metallization then builds up. In this way, a high adhesiveness of the metallization on the substrate is achieved without requiring an additional intermediate step, meaning the intermediate layer and the main layer are precipitated during one operation. Metallization layers that adhere particularly well can be produced on the substrate, especially with use of a short-wave UV light according to the invention.

Another preferred embodiment of the invention provides that electrical strip conductors are produced through metallization in a copper bath. Owing to the high adhesiveness of the metallizations on the substrate, it is possible to produce extremely complex circuits, which can have a high cross-linkage in a small space. A distance between two strip conductors can be kept very small. It is furthermore preferable if electrical resistors are produced through metallization in a nickel or nickel-alloy bath. It is easy to produce highly adhesive electrical resistors in circuit arrangements with this method, which can be incorporated in the total production process for a printed circuit board by using a process step that is easily mastered.

Further advantageous embodiments of the invention follow from the remaining features specified in the dependent claims.

BRIEF DESCRIPTION OF THE DRAWINGS

The invention is explained in the following in more detail with the embodiments and the associated drawings. Shown in.

DESCRIPTION OF THE PREFERRED EMBODIMENTS

Figure 1:
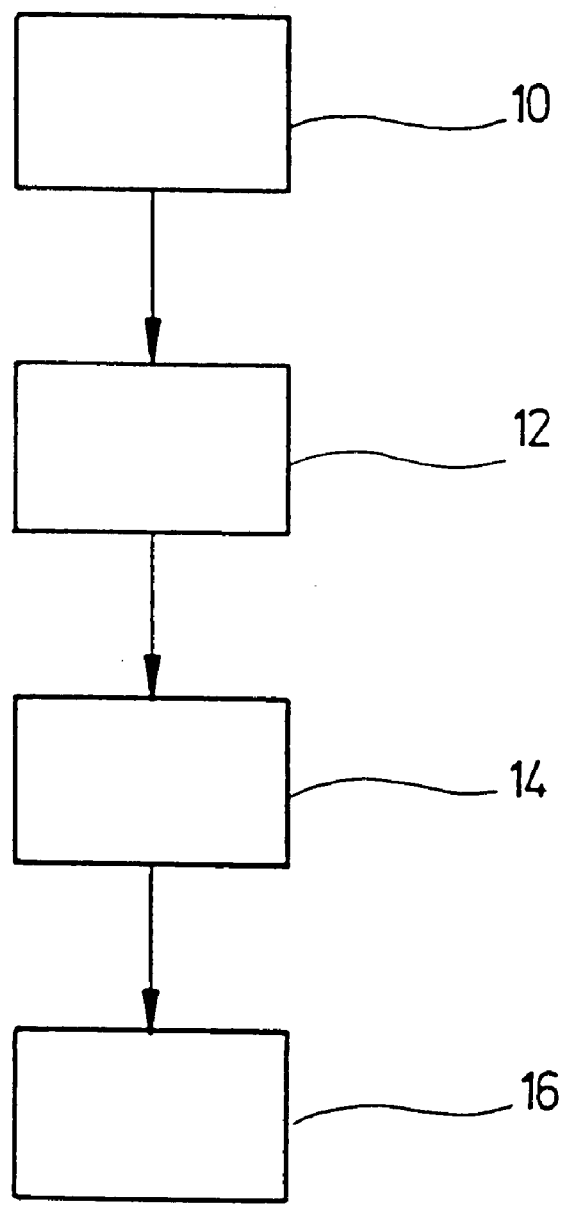
FIG. 1 is a flow chart of the process sequence according to the invention.

FIG. 1 is intended to illustrate the process according to the invention with the aid of a diagram. In a first process step 10, an electrically non-conductive substrate is provided with a carrier layer for the metallization that is still to be explained. Any optional organic or inorganic molded article, which can have a rigid as well as a flexible design, can be used as substrate.

A polyimide foil (Kapton) is used according to a concrete exemplary embodiment. The positive lacquer can be applied to the substrate with generally known process steps, e.g. through spraying on, painting on, rolling on, offset print, screen print, tampon print (gravure printing), dipping, etc. It is not necessary to prepare the substrate prior to applying the positive lacquer. Depending on the process for applying it to the substrate, the positive lacquer has a composition that is specially adjusted to this process. This concerns, for example, the solvents contained in the positive lacquer, which must be selected differently for the tampon print than for the screen print, owing to the varied technological sequence. The positive lacquer furthermore contains organic metal compounds, which serve as activators (germinating cells) for the subsequent metallization.

In accordance with a concrete embodiment, soluble palladium compounds are used as organic metal compounds in organic solvents. These can be the compounds having the chemical formulas as shown in FIG. 3, for example.

The following can be used as palladium compounds:

| | |
|---|---|
| according to a) | palladium acetylacetonate (R=$CH_3$) and phenyl derivative (R=$C_6H_5$); |
| according to b) | palladium glyoximate; |
| according to c) | dichloro(1,3-butadienyl)palladium (II); |
| according to d) | dichlorocyclooctadienyl-(1,5)-palladium (II) |
| according to e) | dichlorobis-(acetonitrile)palladium (II); |
| according to f) | π allyl complex and |
| according to g) | tetrakis-(triphenylphosphine)palladium (O). |

This positive lacquer containing the palladium compounds and solvents, bonding agents, coloring agents etc, which will not be examined in more detail here, is applied to the substrate with a layout that can be selected. In this case, the lacquer can be applied to the substrate surface either over a large region or to selective locations. A positive lacquer within the meaning of the invention is understood to be a lacquer containing light-active components that effect a chemical change in the positive lacquer composition under the influence of light.

Figure 2:
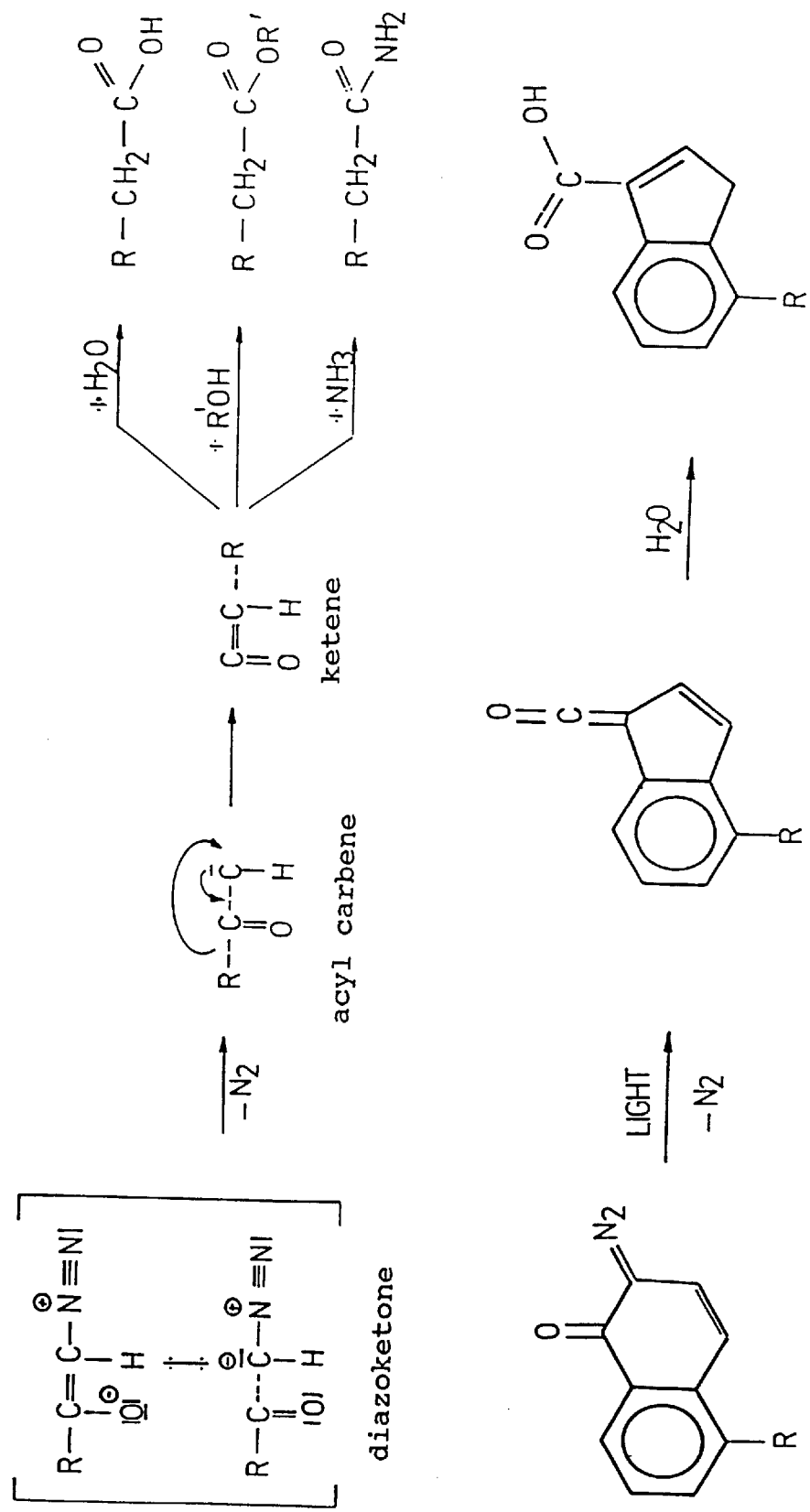
FIG. 2 is a reaction sequence for fixing the positive lacquer during the irradiation with UV light and FIG. 3 are various examples for the use of organic metal compounds in the positive lacquer.
Figure 3A:
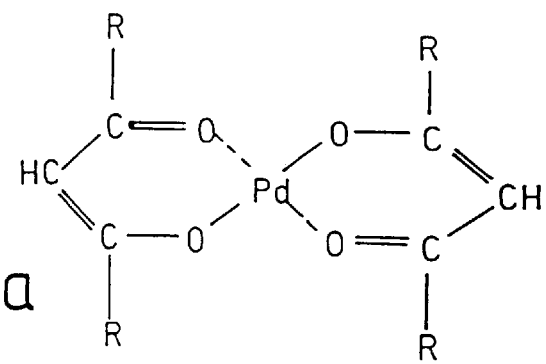
Figure 3B:
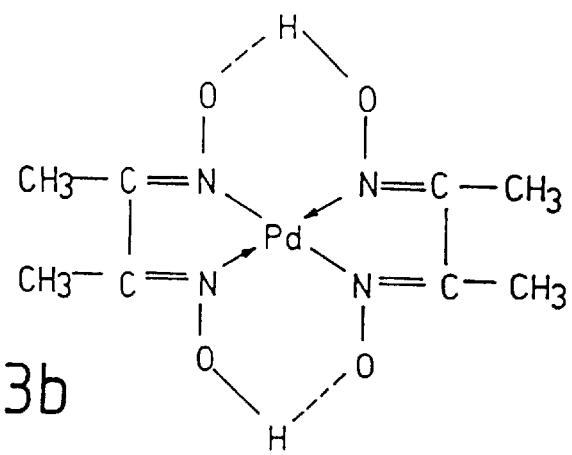
Figure 3C:
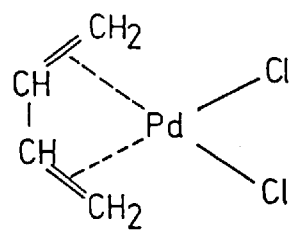
Figure 3D:
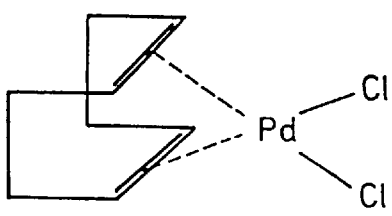
Figure 3E:
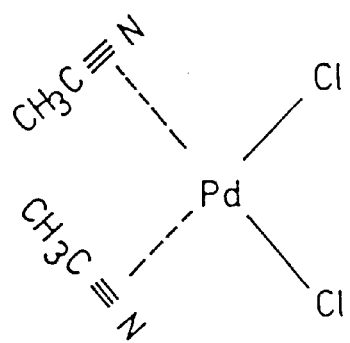
Figure 3F:
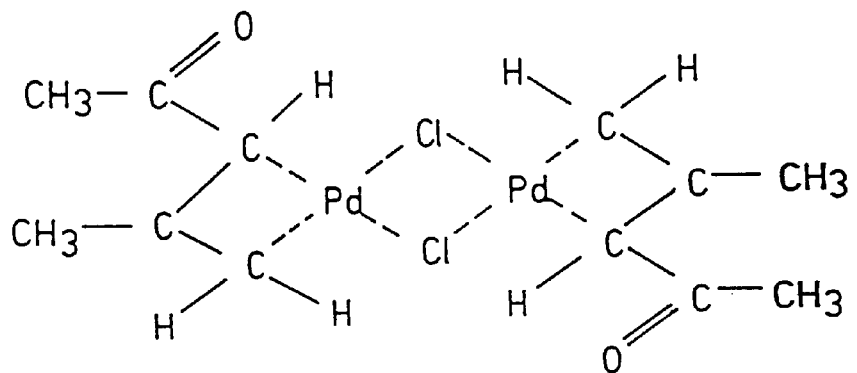
Figure 3G:
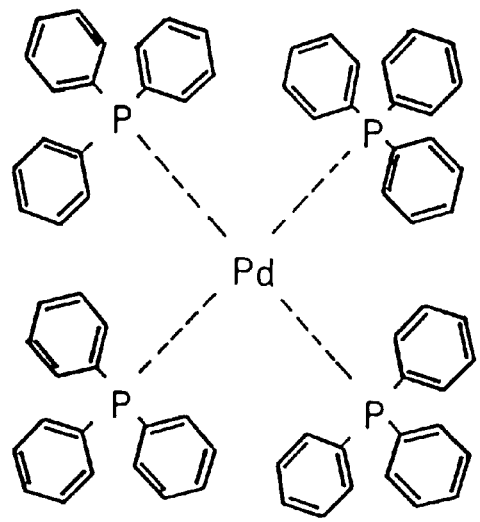

The substrate coated with the positive lacquer is irradiated in a subsequent process step 12 with light from an UV light source. The irradiation with the UV light triggers a reaction in the positive lacquer, which is illustrated with the aid of FIG. 2. The light-active component of the positive lacquer is a diazoketone, for example, which forms a ketene when irradiated with UV light by separating out nitrogen in accordance with the so-called Wolf rearrangement. This ketene then stabilizes based on the Arndt-Eistert Reaction in the presence of humidity ($H_2O$) by forming a carboxylic acid. The palladium compound contained in the positive lacquer as activator is fixed during the here occurring complexation reaction. Following irradiation with the UV light, the positive lacquer together with the palladium compound results in a stable compound that is fixed well on the substrate surface. Illuminating the positive lacquer with the UV light results in the formation of oxygen compounds, which have a decisive effect on the subsequent metallization.

The illumination with the UV light can be varied for coordination with the subsequent metallization. Thus, it is possible to select for the UV light illumination a time interval and/or a UV light with an optional wavelength. Based on a concrete embodiment, for example, an illumination with a UV light source lasts for 10 minutes at an irradiation of 15 . . . 150 mW/cm$^2$ and has wavelengths that are coordinated with the total lacquer system, including the palladium components. Wavelengths of 222, 308, 356 and 400 nm, for example, are suitable. It is possible to influence the formation of the oxygen compounds on the surface of the substrate by varying the irradiation, the wavelength of the UV light and the treatment duration. A varied metallization of the substrate results, depending on the number and type of existing oxygen compounds.

The substrate surface coated with the palladium compounds is subjected in a subsequent process step 14 to a reduction. For this, the substrate is dipped into a reduction bath, for example, preferably a $NaBH_4$ solution, so that the palladium compounds present in an oxidation stage are reduced and a zerovalent palladium is subsequently present. The oxygen compounds on the substrate surface are not changed during this process step.

During a final process step 16, the substrate is placed into a metallization bath. The metallization bath can, for example, be a copper bath. In that case, the substrate regions previously coated with the palladium-containing positive lacquer are copper-plated without current. A currentless copperplating takes place in the copper bath in that copper precipitated from the copper bath reacts with the positive lacquer that is irradiated with the UV light. The copper in this case combines with the oxygen compounds present on the substrate surface to form initially copper oxide CuO, which is deposited on the substrate surface. This copper oxide forms an intermediate layer, which functions to promote adhesion between the substrate and the subsequent actual metallization. Once the free oxygen compounds on the substrate surface are used up for the copper oxide layer formation, pure metallic copper is deposited there. Thus, the precipitating of an adhesive layer and the precipitating of the actual metallization layer occur simultaneously during one process step. As a result, the metallization layer adheres extremely well to the substrate. Depending on the selected layout, with which the positive lacquer enriched with the palladium compounds was deposited on the substrate, the substrates can be provided with strip conductors or larger metallization regions (copper in this case) with an optional geometry. For example, it is possible to obtain strip conductors that adhere extremely well, e.g. with a width of 65 $\mu$m or smaller, a thickness of 2 . . . 3 $\mu$m and also a spacing between them of 65 $\mu$m or smaller. As a result of the excellent adhesion of the metallization, it is possible to achieve a high quality for these small reference grids. A galvanic strengthening of the strip conductors owing to a subsequent galvanic depositing of copper can be achieved if necessary.

According to another embodiment, a nickel or nickel-alloy bath, for example, can be used in place of the copper bath. By doing this, metallization layers of nickel or nickel alloy can be realized on the substrate, which can be integrated favorably into existing circuit arrangements as electrical resistance layers.

Owing to a quite favorable combination of the treatment for the substrates, it is possible to create circuit arrangements having electrical strip conductors as well as electrical resistors. It is possible, for example, to initially structure strip conductors on the substrate and subsequently provide the respective resistance layers by combining or repeating the sequence of the individual process steps. For this, the palladium-containing positive lacquer can be applied several times to the substrate, meaning that after the positive lacquer is applied for the first time, is illuminated with UV light and copper-plated in a copper bath, another layer of palladium-containing positive lacquer can be applied in a following process step to the substrate that already has strip conductors. This layer is then correspondingly illuminated and provided with the resistance layers.

The coating of the substrate with copper or nickel or nickel alloys is only an example. Thus, a metallization with any other suitable metal is of course possible as well. On the whole, it is critical for the process according to the invention that all process steps are performed at room temperature, so that no allowances have to be made for heat-sensitive substrates. However, it is quite possible to perform individual process steps also at higher temperatures. Furthermore, additional heat sources, e.g. for heating up the metallization baths and/or for applying the positive lacquer layer, are not necessary, so that energy can be saved as compared to traditional processes. Extremely fine and highly adhesive structures can be obtained with the process according to the invention for the currentless metallization. In particular the successive depositing of the adhesive layer and the actual metallization layer in one process step result in excellent adhesion values for the metallization on the substrate.

What is claimed is:

1. A process for the currentless metallization of electrically non-conductive substrates, comprising:

providing a substrate which is electrically non-conductive;

depositing on the substrate a positive lacquer comprising at least one polymer which is UV hardenable, at least one organo-metalllic compound, and a substance which is light-active to provide a positive lacquer coated substrate;

irradiating the positive lacquer coated substrate with UV radiation to provide an irradiated coated substrate; and precipitating a metal layer onto the irradiated coated substrate by currentless metallization in a bath effective therefore.

2. The process according to claim 1, wherein, at the start of the currentless metallization, an oxidic intermediate layer is first deposited on the coated substrate.

3. The process according to claim 2, wherein the positive lacquer coated substrate is irradiated with UV radiation at preselected wavelength, time interval, and radiation intensity, and wherein deposition of the oxidic intermediate layer is adjusted by preselecting at least one of the wavelength, time interval, and radiation intensity.

4. The process according to claim 2, wherein a metal layer is deposited on the oxidic intermediate layer.

5. The process according to claim 1, wherein the substrate is comprised of polyimide.

6. The process according to claim 5, wherein the polyimide is Kapton.

7. The process according to claim 1, wherein currentless metallization is performed initially in a copper bath and subsequently in one of a nickel bath or nickel-alloy bath.

8. The process according to claim 1, wherein the positive lacquer coated substrate is irradiated with UV radiation at preselected wavelength, time interval, and radiation intensity so that oxygen compounds of the at least one polymer develop on the surface of the substrate.

9. The process according to claim 1, wherein the UV radiation has a wavelength ranging from 222 nm to 400 nm.

10. The process according to claim 1, wherein the irradiated coated substrate is treated prior to currentless metallization with a reduction agent in a reduction bath.

11. The process according to claim 1, wherein the organo-metallic compound is an organo-metallic palladium compound.

* * * * *